(12) United States Patent
Mizoguchi

(10) Patent No.: US 8,215,965 B2
(45) Date of Patent: Jul. 10, 2012

(54) FEMALE CONNECTOR, MALE CONNECTOR ASSEMBLED TO THE SAME, AND ELECTRIC/ELECTRONIC APPARATUS USING THEM

(75) Inventor: Masanori Mizoguchi, Tokyo (JP)

(73) Assignee: Asahi Denka Kenkyusho Co., Ltd., Tokyo (JP)

( * ) Notice: Subject to any disclaimer, the term of this patent is extended or adjusted under 35 U.S.C. 154(b) by 50 days.

(21) Appl. No.: 12/741,108

(22) PCT Filed: Apr. 24, 2009

(86) PCT No.: PCT/JP2009/058137
§ 371 (c)(1),
(2), (4) Date: Oct. 12, 2010

(87) PCT Pub. No.: WO2010/047141
PCT Pub. Date: Apr. 29, 2010

(65) Prior Publication Data
US 2011/0039427 A1 Feb. 17, 2011

(30) Foreign Application Priority Data
Oct. 21, 2008 (JP) .................................. 2008-270984

(51) Int. Cl.
*H01R 12/00* (2006.01)
(52) U.S. Cl. .......................................... 439/66; 361/760
(58) Field of Classification Search .................. 439/66; 361/760
See application file for complete search history.

(56) References Cited

U.S. PATENT DOCUMENTS

| | | |
|---|---|---|
| 5,384,435 A | 1/1995 | Fuerst et al. |
| 5,816,828 A | 10/1998 | Ikeya et al. |
| 6,086,386 A | 7/2000 | Fjelstad et al. |
| 6,142,789 A * | 11/2000 | Nolan et al. ............... 439/66 |
| 6,205,660 B1 * | 3/2001 | Fjelstad et al. ............ 29/885 |
| 6,407,927 B1 * | 6/2002 | Fasano ....................... 361/760 |
| 6,854,985 B1 * | 2/2005 | Weiss ......................... 439/91 |
| 7,114,961 B2 * | 10/2006 | Williams .................... 439/66 |
| 7,121,839 B2 * | 10/2006 | Rathburn ................... 439/66 |
| 7,363,688 B2 * | 4/2008 | McAllister et al. ....... 29/402.08 |
| 2009/0233465 A1 | 9/2009 | Mizoguchi |

FOREIGN PATENT DOCUMENTS

| | | |
|---|---|---|
| JP | 7 226238 | 8/1995 |
| JP | 9 199247 | 7/1997 |
| JP | 2000 512065 | 9/2000 |
| JP | 4059522 | 3/2008 |

OTHER PUBLICATIONS

U.S. Appl. No. 12/992,479, filed Nov. 12, 2010, Mizoguchi.

* cited by examiner

*Primary Examiner* — Truc Nguyen
(74) *Attorney, Agent, or Firm* — Oblon, Spivak, McClelland, Maier & Neustadt, L.L.P.

(57) ABSTRACT

A female connector which is useful for space saving and height reduction of a connector connection portion is a female connector including: an insulating film having flexibility; a plurality of pad portions formed at predetermined positions on one face of the insulating film in an arranged manner; female terminal portions composed of openings formed at one lateral portions within faces of the pad portions so as to extend up to the other face of the insulating film; and spacer bumps formed at positions corresponding to the other lateral positions within the faces of the pad portions in a standing manner within the other face of the insulating film, proximal portions of the spacer bumps being electrically connected to the pad portions.

19 Claims, 10 Drawing Sheets

FEMALE CONNECTOR, MALE CONNECTOR ASSEMBLED TO THE SAME, AND ELECTRIC/ELECTRONIC APPARATUS USING THEM

TECHNICAL FIELD

The present invention relates to a female connector which itself is mounted on a circuit board as one mounting part to be used, and in particular to a female connector which uses an insulating film having flexibility as a base member and is manufactured by applying plating technique and photolithography technique to the insulating film. Further, the present invention relates to a male connector which is assembled to the abovementioned female connector to be used, and further relates to an electric/electronic apparatus using abovementioned female connector and male connector.

BACKGROUND ART

According to the progress of size-reducing, thinning, multi-functioning, and weight-reducing of various electric/electronic apparatuses, a demand for size-reducing and thinning of parts mounted on circuit boards assembled to these apparatuses is increasing.

Then, regarding a connector structure which is a relay point for performing electrical connection between circuit boards or between parts, a demand for size-reducing (space saving) and thinning (height-reducing) thereof is increasing.

A female connector or a male connector, particularly, the female connector is conventionally manufactured by performing punching work to a thin metal plate material to a predetermined shape using a die. Then, a connector structure is formed by mounting the female connector on input/output terminals of a circuit board, for example, by soldering to assembling a male connector to the female connector.

However, in the case of the connector structure formed by such a method, it was difficult to reduce the height of a connection portion between both the connectors to 1.0 mm or less and it was difficult to reduce a pitch between terminals to 0.5 mm or less, so that limits of space saving and height reduction were reached.

In order to solve such a problem, the following connector structure was developed. This is a connector structure (an electric connection structure) obtained by assembling a female connector, the female connector being manufactured by using a flexible circuit board as a base material and applying plating technique, photolithography technique, and etching technique to the flexible circuit board and including the flexible circuit board which is the base material and female terminal portions utilizing resiliency of pad portions formed on the flexible circuit board, and a male connector having male terminal portions and manufactured separately from the female connector (see Patent Literature 1).

In the connector structure, since the height of a connection portion between the female connector and the male connector can easily be reduced to 0.5 mm or less and a pitch between terminals can be reduced to 0.5 mm or less, space saving can be realized. Further, by adopting a matrix configuration in arrangement of terminals, multi-pin configuration can be realized while space saving is ensured. In addition, repair treatment is made possible in the case of the connector structure.
Patent Literature 1: Japanese Patent No 4059522

SUMMARY OF INVENTION

Technical Problem

Now, the female connector in the connector structure disclosed in Patent Literature 1 is manufactured in a state that the female terminal portions are assembled as portions of the flexible circuit board on which a conductor circuit with a predetermined pattern is printed. That is, such a structure is adopted that the female connector itself cannot be used separately from the flexible circuit board.

Therefore, when the connector structure disclosed in Patent Literature 1 is tried to be assembled, it is necessary to form the female terminal portions disclosed in Patent Literature 1 for each of flexible circuit boards to be used. In order to form the female terminal portions, however, it is necessary to apply complicated micromachining to, for example, a fine portion at a distal end of each elongate flexible circuit board to form female terminal portions therein while handling the flexible circuit board. This is not desirable industrially.

The present invention is a female connector which has been developed to solve the above problem in the connector structure disclosed in Patent Literature 1, and an object thereof is to provide a female connector which is not manufactured in a state where it is assembled as a portion of a flexible circuit board to be used but manufactured as a member separate from the flexible circuit board, and which functions as a single independent mounting part provided with a structure of the female connector disclosed in Patent Literature 1, even if manufactured in such a manner, and is therefore mounted on a flexible circuit board on which a conductor circuit with a predetermined pattern has been already printed to be used.

In the present invention, a male connector which is assembled to the female connector is provided and various electric/electronic apparatuses used in a connection portion of a circuit board in which the female connector is incorporated are provided.

Solution to Problem

In order to solve the above problem, according to the present invention, there is provided a female connector including:
an insulating film having flexibility;
a plurality of pad portions formed at predetermined positions on one face of the insulating film in an arranged manner;
female terminal portions comprising openings formed at one lateral portions within faces of the pad portions so as to extend up to the other face of the insulating film; and
spacer bumps formed at positions corresponding to the other lateral positions within the faces of the pad portions in a standing manner within the other face of the insulating film, proximal portions of the spacer bumps being electrically connected to the pad portions.

In this case, it is preferable that when rectangular shapes are each drawn by connecting the centers of four openings adjacent to each other in an arrangement group of the openings arranged on the other face of the insulating film and visually recognized, the spacer bumps, are provided at positions corresponding to intersection points of orthogonal lines of the rectangular shapes in a standing manner.

The female connector is used in a state that the distal end top portions of the abovementioned spacer bumps are electrically connected to input/output terminals of a first circuit board on which a conductor circuit with a predetermined pattern is printed.

It is preferable that dummy spacer bumps with the same height as the spacer bumps are further provided in a standing manner outside the openings positioned on an outermost row included in arrangement groups of the openings and the spacer bumps arranged on the other face of the insulating film and visually recognized.

According to the present invention, there is provided the female connector where it is desirable that a male connector used as a mating member incorporated with the female connector is a male connector including an insulating flexible film, pads for mounting formed on one face of the flexible film, male terminal portions provided on the other face of the flexible film in a projecting manner, proximal portions of the male terminal portions being electrically connected to the pads for mounting, and protrusions for engagement formed on a peripheral portion of the flexible film so as to project in the same direction as the directions of the male terminal portions, where the pads for mounting are electrically connected to input/output terminals of a second circuit board on which a conductor circuit with a predetermined pattern is printed to be mounted on the second circuit board.

In this case, it is preferable that a female connector guide member for suppressing occurrence of flexure of the insulating film at an assembling time of the male connector into the female connector and guiding the male terminal portions of the male connector assembled into the openings and fixing the male terminal portions therein is arranged on the other face of the insulating film in a fixed manner.

According to the present invention, there is provided a male connector which is assembled to the female connector according to the present invention to be used, the male connector having male terminal portions of the same number as the number of the female connectors, the height of the male terminal portions being lower than the height of the spacer bumps, the male terminal portions being inserted into the openings of the female connector to be brought in pressure contact with the pad portions of the female connector to form an electric connection structure at an assembling time with the female connector.

Further, according to the present invention, there is provided an electric/electronic apparatus which has output/input terminals for electric signals incorporated with a circuit board on which the female connector according to the present invention is mounted.

Advantageous Effects of Invention

The female connector according to the present invention includes a thin and flexible insulating film having a thickness of about 10 to 50 μm as a base material. Since an arrangement group of thin pad portions is formed on one face of the insulating film, and the openings reaching the opposite face of the insulating film are formed within planes of the pad portions, and the spacer bumps with a height of about 100 to 300 μm are provided on the opposite face (the opposite face of the insulating film) within planes of the pad portions in a standing manner, the spacer bumps can be electrically connected to the input/output terminals of the first circuit board to be used.

That is, the female connector itself is a female connector which is a single item and can be mounted on a circuit board, which is considerably reduced in height, where the openings are flexible and function as the female terminal portions (connection points with the male terminal portions). By forming the openings, for example, in a matrix arrangement, a multi-pin configuration can be realized easily.

The female connector according to the present invention is used as a pair with a male connector described later, so that significant space saving and height reducing of a connection portion between the female connector and the male connector can be realized as compared with the conventional connector structure.

DESCRIPTION OF EMBODIMENTS

A basic structure $C_0$ of a female connector according to the present invention will be first explained with reference to the drawings.

Figure 1:
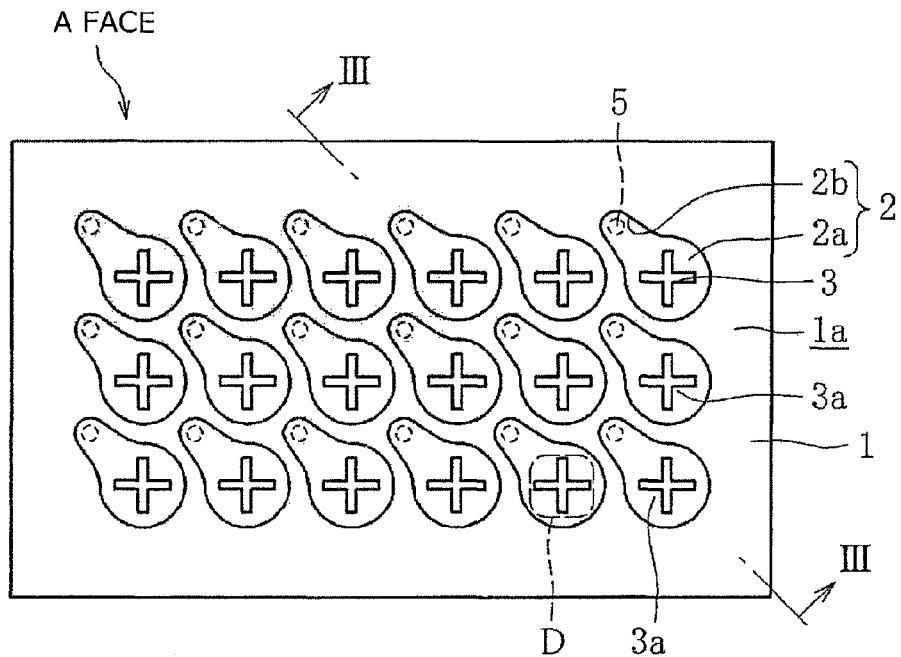
FIG. 1 is a plan view showing an A face side of a female connector $C_0$ which is a basic structure.
Figure 2:
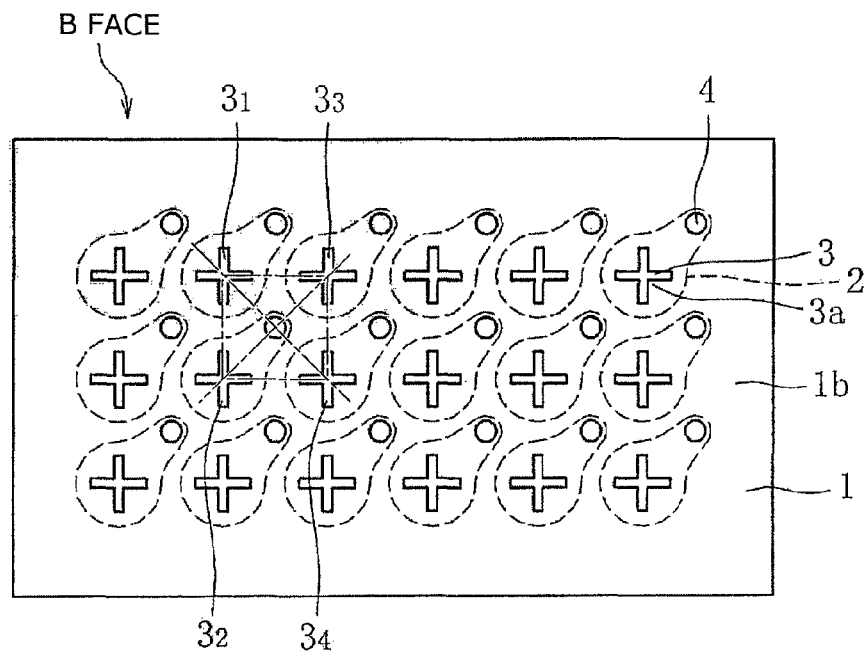
FIG. 2 is a plan view showing a B face side of the female connector $C_0$.
Figure 3:
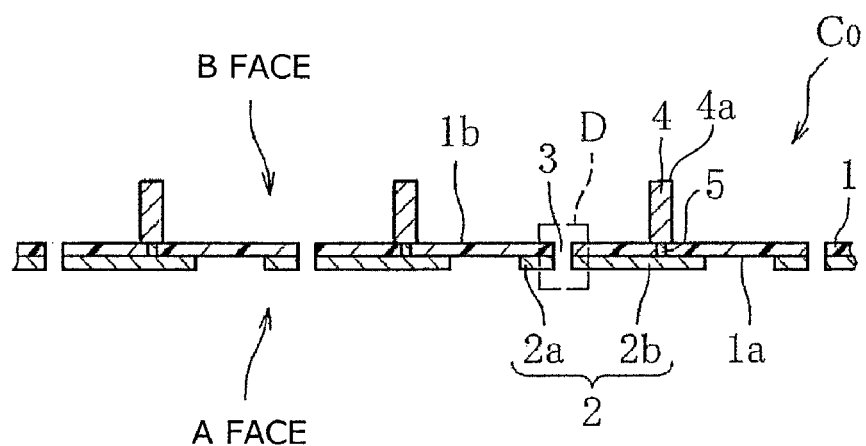
FIG. 3 is a sectional view of the female connector $C_0$ taken along line in FIG. 1.

FIG. 1 is a plan view showing one example of an arrangement group of pad portions formed on one face (hereinafter, called "A face") of an insulating film which is a base material in the female connector $C_0$ with a basic structure. FIG. 2 is a plan view showing one example of arrangement states of spacer bumps arranged on the other face (hereinafter, called "B face") of the insulating film in a standing manner and openings described later. FIG. 3 is a sectional view of the female connector $C_0$ taken along line in FIG. 1.

As illustrated, in the female connector $C_0$, thin pad portions 2 made from conductive material are formed on an A face 1a of a thin insulating film 1 with flexibility formed in a rectangular shape in plan view in a state that they are arranged in a matrix manner (three columns and six rows in the illustration).

The pad portion 2 is formed in a Daruma (hereinafter, called "pear") shape in plan view shape as a whole. That is, one lateral portion of the pad portion 2 is a large diameter portion 2a with a diameter of about 100 to 500 μm, while the other lateral portion thereof is a small diameter portion $2b$ with a diameter of about 50 to 250 μm, and these portions are connected to each other, which results in the pear shape. In the large diameter portion $2a$, a slit opening 3 with a cross shape is formed to extend from the surface of the pad portion 2 to the B face $1b$ of the insulating film 1.

Incidentally, the slit opening 3 and four tongue portions $3a$ formed around the opening 3 function as a female terminal portion D in the female connector $C_0$, as described later.

Further, a spacer bump 4 made from conductive material is provided in a standing manner on a portion of the B face $1b$ of the insulating film 1 positioned at the small diameter portion $2b$ in the pad portion 2. A proximal portion of the spacer bump 4 is electrically connected to a corresponding pad portion 2 via a column-shaped conductor 5 formed from the B face $1b$ of the insulating film 1 to the smaller diameter portion $2b$ of the pad portion 2 positioned just below the proximal portion.

As described later, the spacer bump 4 is configured such that its distal end top portion $4a$ is connected to an input/output terminal of a circuit board (a first circuit board) on which a conductor circuit with a predetermined pattern is printed to function as a connection terminal for electrically connecting the female connector $C_0$ and the first circuit board.

Since the female connector $C_0$ has such a structure, a portion of the A face $1a$ of the insulating film 1, an arrangement group of the pad portions 2 arranged in a matrix manner thereon, and an arrangement group of the slit openings 3 formed in the large diameter portions $2a$ of the pad portions can be visually recognized on the A face $1a$ of the insulating film 1, as shown in FIG. 1. However, the spacer bumps 4 cannot be visually recognized.

On the other hand, as shown in FIG. 2, a portion of the B face $1b$ of the insulating film 1, an arrangement group of the slit openings 3 arranged in a matrix manner thereon, an arrangement group of the spacer bumps 4 provided in a standing manner in a matrix arrangement like the slit openings 3 can be visually recognized. However, the pad portions 2 cannot be visually recognized.

In plan view of the female connector $C_0$ from a different viewpoint, the slit opening 3 and the spacer bump 4 are formed within a plane area occupied by the pad portion 2, and the slit openings 3 and the spacer bumps 4 are formed within the respective plane areas in paired manner.

Here, as the insulating film 1, for example, a film made from insulating resin such as polyimide, polyester, liquid crystal polymer, or polyether ketone can be used, but a thin glass fiber epoxy resin composite plate, a BT resin plate, or the like can also be used.

It is desirable from the viewpoint of height reduction of a connection portion with a male connector to be assembled that the thickness of the insulating film 1 is made thin as much as possible, but it is preferable that the thickness is set to about 10 to 50 μm in view of a whole mechanical strength of the insulating film 1.

Further, a planar size and a planar shape of the insulating film 1 can be properly selected according to the size of the pad portions 2 formed on the A face $1a$, the number of the pad portions 2, the arrangement pattern of the pad portions 2, or the like, but when the pad portions 2 with a pear shape are formed with an arrangement pattern of three columns and six rows, for example, as shown in FIG. 1, a rectangle-shaped insulating film with a rectangle shape having a vertical size of about 3 mm and a horizontal size of about 5 mm can be adopted.

It is required that the pad portions to be formed on the A face $1a$ of the insulating film 1 have been formed in a state that they are independent from one another and insulation among respective pad portions is ensured.

Incidentally, the planar shape and the arrangement pattern of the respective pad portions 2 are not limited to specific ones, but the shape and the arrangement pattern of the pad portions 2 should be designed considering a viewpoint where formation within plane areas occupied by the pad portions 2 is performed in a state that the spacer bumps 4 provided on the B face $1b$ of the insulating film 1 in a standing manner, the column-shaped conductors 5 formed on proximal portions thereof, the slit openings 3 functioning as the female terminal portions D, and the tongue portions $3a$ positioned near the slit openings do not become dysfunctional mutually. Simultaneously therewith, it is preferable that designing is performed adding a viewpoint where a formation density of the female terminal portions D in the female connector $C_0$ is enhanced to realize multi-pin and space-saving configuration.

From these viewpoints, as shown in FIG. 1, when the pad portions 2 with a pear shape comprising the large diameter portion $2a$ formed on one lateral portion and the small diameter portion $2b$ formed on the other lateral portion are arranged in a state that they are inclined by angle of 45° as illustrated, the formation density of the slit openings 3 can be enhanced, which is desirable because the above viewpoint is satisfied.

Incidentally, the example where the pad portions 2 with a pear shape are arranged in a matrix manner and the slit openings 3 are also arranged in a matrix manner has been shown in the illustration, but the arrangement pattern of the pad portions is not limited to this example, and the pad portions can be arranged in a staggered manner, for example.

As a material for forming the pad portions 2, as described later, a material having conductive property and spring elasticity is desirable because when the male terminal portion is assembled into the female terminal portion D, the tongue portions $3a$ of the pad portion in the female terminal portion D is curved in an insertion direction of the male terminal portion so that the tongue portions $3a$ are brought into pressure contact with the male terminal portion by restoring force generated at this time, so that a conduction structure between both the connectors is formed. Such a material, for example, copper, nickel, stainless steel, nickel alloy, beryllium copper alloy, and the like can be involved.

Further, regarding the thickness of the pad portion 2, it is preferable that the upper limit of the thickness is set to about 100 μm when the abovementioned material is used, considering development of excellent spring elasticity.

The slit opening 3 is formed as a through-hole extending from the surface of the pad portion 2 to the B face $1b$ of the insulating film 1. The plane shape of the slit opening 3 is not limited to the cross shape shown in FIG. 1 and FIG. 2. The plane shape may be any shape where when the male terminal portion of the male connector is inserted into the slit opening 3 from the surface side of the pad portion 2, four tongue portions $3a$ near the slit opening 3 (in the case of illustration) are curved in an insertion direction of the male terminal portion and the tongue portions $3a$ can be brought into pressure contact with the male terminal portion by restoring force of the tongue portions $3a$, and the plane shapes cited in Japanese Patent No. 4059522 (Patent Literature 1) can be adopted besides the cross shape shown in FIG. 1.

When such pad portions 2 are formed, for example, pad portions with a desired plane shape and an arrangement pattern thereof can be formed by performing nonelectrolytic plating and electrolytic plating to the A face $1a$ of the insulating film 1 to form a metal thin film with a predetermined thickness and then applying photolithography technique and etching technique to the metal thin film.

Further, when the slit openings 3 are formed, slit openings with the same shape as the opening pattern can be formed on the insulating film by applying photolithography technique and etching technique to the surfaces of the pad portions formed in the above manner to provide opening patterns with a desired plan view shape in the pad portions, thereby exposing the surface of the insulating film 1 from the opening patterns, and then irradiating the opening patterns with, for example, laser beam to remove exposed portions of the insulating film in a thickness direction thereof.

The spacer bumps 4 function as connection terminals when the female connector $C_0$ is connected or mounted on input/output terminals of a first circuit board, as described above, and simultaneously therewith, function as spacers for keeping constant interval between all the female terminal portions D in the female connector $C_0$ and input/output terminals of the abovementioned first circuit board.

These spacer bumps 4 can be formed in the following manner. First of all, arrangement of small holes reaching the pad portions 2 on the A face 1a is formed at predetermined portions of the B face 1b in the insulating film 1 by laser processing, for example. Then, electrolytic plating utilizing the pad portions 2 as negative pole is performed to fill metal material into the small holes, thereby forming column-shaped conductors 5. Next, bumps with desired diameter and height are formed by applying photolithography technique, etching technique, and plating technique to exposed faces (the B face 1b of the insulating film 1) of the column-shaped conductors. Incidentally, the thickness of photoresist used at an application time of the photolithography technique is set to the same height as a target height of the spacer bumps to be formed.

The spacer bumps 4 are provided in a standing manner such that the center of each spacer bump 4 is positioned at an intersection point of orthogonal lines of the rectangular shape drawn by connecting the centers of four slit openings $3_1$, $3_2$, $3_3$, and $3_4$ adjacent to one another in an arrangement group of the slit openings 3 visually recognized on the B face 1b of the insulating film 1, as shown by broken lines in FIG. 2. Therefore, the pad portions 2 formed on the A face 1a of the insulating film 1 are designed to have a shape and an arrangement pattern so as to satisfy a positional relationship between the slit openings 3 and the spacer bumps 4.

The height and diameter of the spacer bump 4 can be set properly. For example, in the case of the female connector $C_0$ shown in FIG. 1 to FIG. 3, it is preferable that the height is set to about 100 to 400 μm and the diameter is set to about 100 to 300 μm.

Now, as shown in FIG. 3, the spacer bump 4 can be directly provided in a standing manner on the B face of the insulating film 1 via the column-shaped conductor 5, but since the diameter of the column-shaped conductor 5 is ordinarily in a range of about 20 to 100 μm, a connection state between the spacer bump 4 with a diameter larger than that of the column-shaped conductor 5 and the column-shaped conductor 5 becomes unstable, a drawback, may occur in connection reliability between both of the members.

Figure 4:
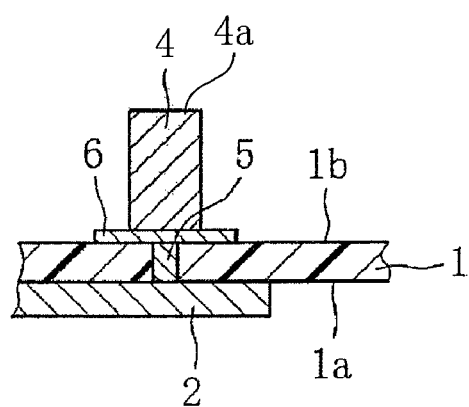
FIG. 4 is a sectional view showing a standing state of a spacer bump.

As shown in FIG. 4, therefore, it is desirable to adopt a structure obtained by, after the column-shaped conductor 5 is formed in the insulating film 1, applying photolithography technique and etching technique to the B face 1b to form a pad 6 with a diameter larger than that of the spacer bump 4 and then providing a space bump 4 with a target shape on the pad 6 in a standing manner. By adopting such a structure, a close coherent area between the pad 6 and the B face 1b of the insulating film 1 is made large and the whole face of the proximal portion of the spacer bump 4 is integrated with the pad 6, so that a connection state between both of the members is stabilized.

As a material for forming the spacer bump 4, any conductive metal material to which plating technique can be applied can be used. For example, there are nickel, stainless steel, beryllium copper, phosphor bronze, and the like as desirable examples.

Incidentally, the spacer bump 4 can be formed by piercing a metal pin having predetermined diameter and length into the insulating film 1 from the B face 1b thereof to provide the same in a planting manner and bringing a distal end of the metal pin in contact with the pad portion 2.

Figure 5:
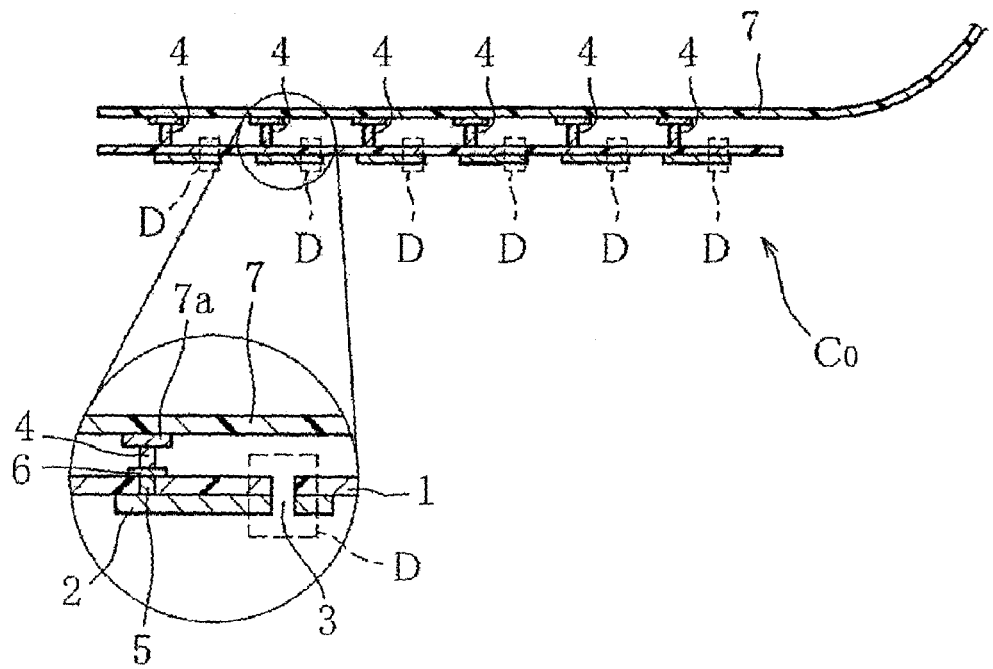
FIG. 5 is a sectional view showing a state that the female connector $C_0$ has been mounted on a first circuit board.

As shown in FIG. 5, the female connector $C_0$ is used by connecting distal end top portions 4a of the spacer bumps 4 to input/output terminals 7a formed on, for example, an edge portion of a first circuit board 7 such as a flexible circuit board on which a conductor circuit (not shown) with predetermined pattern is printed.

Therefore, the arrangement pattern of the spacer bumps provided on the side of the B face 1b of the female connector $C_0$ in a standing manner is formed in a pattern corresponding to an arrangement pattern of the input/output terminals 7a of the first circuit board 7.

Thus, the female connector $C_0$ is mounted on the edge portion of the first circuit board 7 in a state that the female terminal portions D are arranged so as to be spaced from the surface of the first circuit board 7 by a fixed distance.

Incidentally, connection between the input/output terminal 7a and the spacer bump 4 may be performed by reflow processing using, for example, solder, Au—Sn alloy, or the like, and it may be performed by using anisotropically-conductive film (ACF).

A connector structure is assembled by assembling a male connector which is a mating member to the female connector $C_0$ put in such a state.

Figure 6:
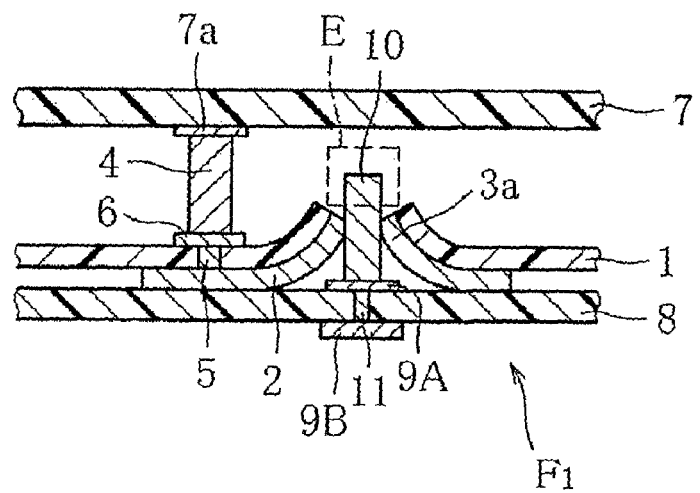
FIG. 6 is a sectional view showing a state that a male terminal portion of a male connector has been inserted into a female terminal portion of the female connector $C_0$.

One example $F_1$ of a male connector used in this case and a state that the male connector has been assembled to the female connector $C_0$ are shown in FIG. 6.

The male connector $F_1$ includes an insulating flexible film 8 as a base material. Protrusions 10 are provided on an upper face of the flexible film 8 via pads 9A. The protrusions 10 function as male terminal portions E. A proximal portion of the protrusion 10 (a male terminal portion E) is electrically connected to a pad 9B also formed on a back face of the flexible film 8 via a conductive via 11 which is a column-shaped conductor formed in a thickness direction of the flexible film 8.

Incidentally, as described later, the pad portion 9B functions as a pad for mounting when the male connector $F_1$ is mounted on a second circuit board.

The male connector $F_1$ having such a structure can be manufactured easily by utilizing a combination of photolithography technique, etching technique and plating technique like the case of the female connector $C_0$. Further, the protrusion 10 (male terminal portion E) can be also formed by piercing a metal pin into the flexible film 8 to provide the same in a planting manner and bring a distal end of the metal pin in contact with the pad 9B.

Incidentally, in the structure of the male connector $F_1$, it goes without saying that the number of protrusions 10 (male terminal portions E) and the arrangement pattern thereof are equal to the number of slit openings 3 (female terminal portions D) of the female connector $C_0$ which is a mating member and the arrangement pattern thereof.

As shown in FIG. 6, the height of the protrusion 10 (male terminal portion E) is set to such a height that the protrusion 10 (male terminal portion E) does not come in contact with the first circuit board 7 when the male connector $F_1$ is assembled to the female connector $C_0$. Specifically, the height of the protrusion 10 is set to be equal to or lower than the height of the spacer bump 4 of the female connector $C_0$.

When both the connectors are assembled to each other, the male terminal portion E of the male connector $F_1$ pushes the slit opening 3 in the female terminal portion D of the female connector $C_0$ in an opening manner to be inserted therein. As shown in FIG. 6, the tongue portions 3a positioned near the slit opening 3 are bent in an insertion direction of the male terminal portion E. At this time, since restoring forces of the pad portion 2 and the insulating film 1 arise, the surfaces of the pad portion 2 in the tongue portions 3a are brought into pressure contact with the barrel portion of the male terminal portion E, where a conduction structure is formed between the female connector $C_0$ and the male connector $F_1$.

That is, in the assembling shown in FIG. 6, a conduction path is formed through the input/output terminal 7a of the first circuit board 7, the spacer bump 4, the pads 6, the column-shaped conductor 5, the pad portion 2, the male terminal portion E (projection 10), the pad 9A, the conductive via 11, and the pad 9B.

The female connector $C_0$ is a female connector of a single item having such a structure as described above. Then, the female connector $C_0$ is used in such an aspect as described above.

Then, a further useful female connector can be manufactured by further adding the following means to the female connector $C_0$.

This will be explained below.

First, the base material of the female connector $C_0$ is a thin insulating film rich in flexibility. Therefore, the base material of the female connector $C_0$ is originally deformable.

For example, when a portion of the insulating film positioned near a portion where the spacer bump 4 is provided in a standing manner and a portion of the insulating film positioned at a portion where the spacer bump 4 is not provided in a standing manner are compared with each other, the former is difficult to be deformed since it is in a state that it is constrained by the spacer bump 4 and the pad 6 on which the spacer bump 4 is provided in a standing manner, but the latter is in a deformable state since it is not in the constrained state. In addition, since the spacer bump 4 is connected to an input/output terminal 7a of the first circuit board 7 to be fixed thereto at a use time of the female connector $C_0$, the portion of the insulating film 1 near the spacer bump 4 is put in a state strongly constrained by the spacer bump 4, so that the former is put in a state that it is significantly difficult to be deformed as compared with the latter.

Specifically, for example, in FIG. 2 showing the arrangement groups of the slit openings 3 and the spacer bumps 4 visibly recognized on the side of the B face 1b of the insulating film 1, the spacer bumps 4 are provided in a standing manner at respective portions positioned on obliquely upper right sides of the slit openings 3 arranged and they are arranged in line in lateral direction. Therefore, a portion of the insulating film positioned above the group of the space bumps arranged in the first row and a portion of the insulating film positioned on the right side of the spacer bumps arranged at the rightmost position are difficult to deform.

On the contrary, a portion of the insulating film positioned on the left side of the slit openings arranged at the leftmost position in the illustration and a portion of the insulating film positioned below the slit openings arranged at the lowermost position are deformable since the spacer bumps 4 (and the pads 6) are not formed on these portions.

Therefore, when the female connector $C_0$ is arranged to the first circuit board 7 with the aspect shown in FIG. 5, a portion of the insulating film 1 near the female terminal portions D positioned at the rightmost side (and the surface side in the illustration) in FIG. 5 is put in a deformable state.

When the male connector $F_1$ is assembled to the female terminal portions D in this state, deformation of a portion of the insulating film near the female terminal portions (the slit openings) positioned at the rightmost side (and the surface side in the illustration) takes place due to an insertion pressure of the male terminal portions E. A positional deviation of another female terminal portion also takes place due to the deformation. As a result, such a problem arises that all the male terminal portions are not assembled to the female terminal portions in a lump smoothly.

In order to prevent such a problem, the following female connector $C_1$ is provided according to the present invention.

Figure 7:
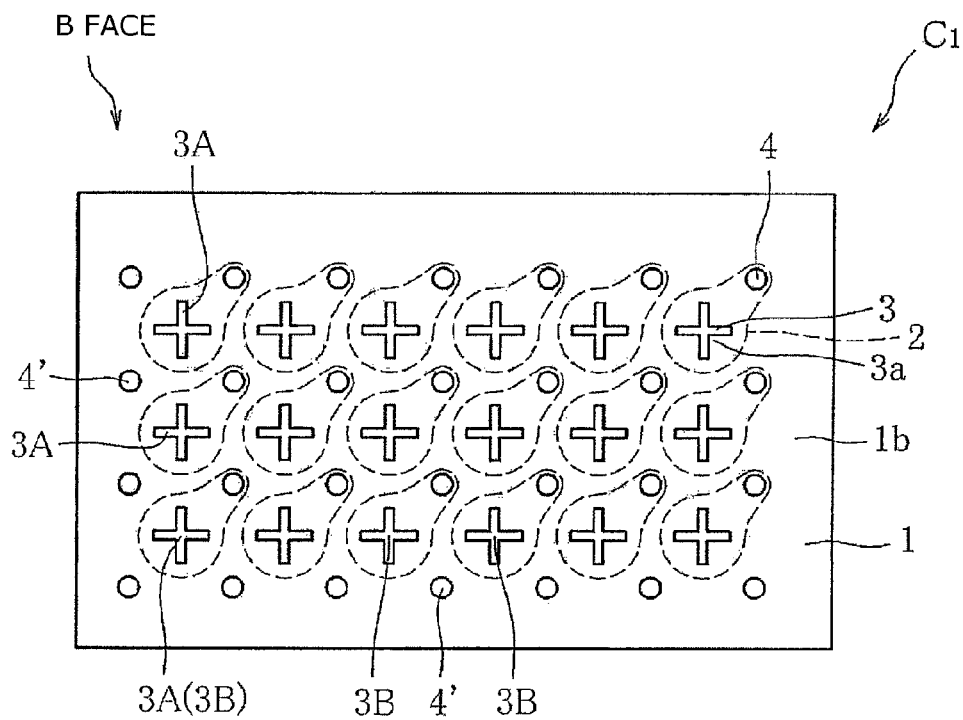
FIG. 7 is a plan view showing a B face side of a female connector $C_1$.

The female connector $C_1$ is shown in FIG. 7.

The female connector $C_1$ has such a structure that dummy spacer bumps 4' which are not required to electrically connect to input/output terminals of the first circuit board and which have the same height as those of the spacer bumps 4 are provided in a standing manner outside the slit openings positioned on the outermost line of the arrangement groups of the slit openings 3 and the spacer bumps 4 arranged on the side of the B face of the insulating film 1.

In FIG. 7, the dummy spacer bumps 4' are provided in a standing manner at portions of the insulating film positioned on the obliquely lower left side of the respective slit openings 3A arranged on the leftmost side in the female connector $C_0$ and the respective slit openings 3B arranged on the lowermost line.

Specifically, assuming that pad portions are further formed in lines on the left side of the slit openings 3A and below the slit opening 3B and a slit opening and a spacer bump as paired are formed within a plane area occupied by each pad portion, the dummy spacer bump 4' is provided in a standing manner at a formation portion of the virtual spacer bump.

Accordingly, the dummy spacer bump 4' is different from the spacer bump in that the former is not electrically connected to the pad portion 2.

By providing the dummy spacer bumps 4' in a standing manner in such an aspect, each of the slit openings 3 is put in a state that its four corners are surrounded by bumps having the same height on the side of the B face 1b of the insulating film 1. Therefore, the insulating film around each slit opening is constrained so that its deformation is suppressed. Portions of the insulating film positioned on the left side of the dummy spacer bump 4' and below the same are constrained by the dummy spacer bump so that deformation thereof is suppressed.

From the above, the male terminal portions E of the male connector $F_1$ can be smoothly inserted into the female terminal portions D in a lump if the female connector $C_1$ is used.

Incidentally, the abovementioned dummy spacer bumps 4' can be formed simultaneously when the arrangement group of the spacer bumps 4 is formed.

Next, another female connector $C_2$ of the present invention will be explained.

Figure 8:
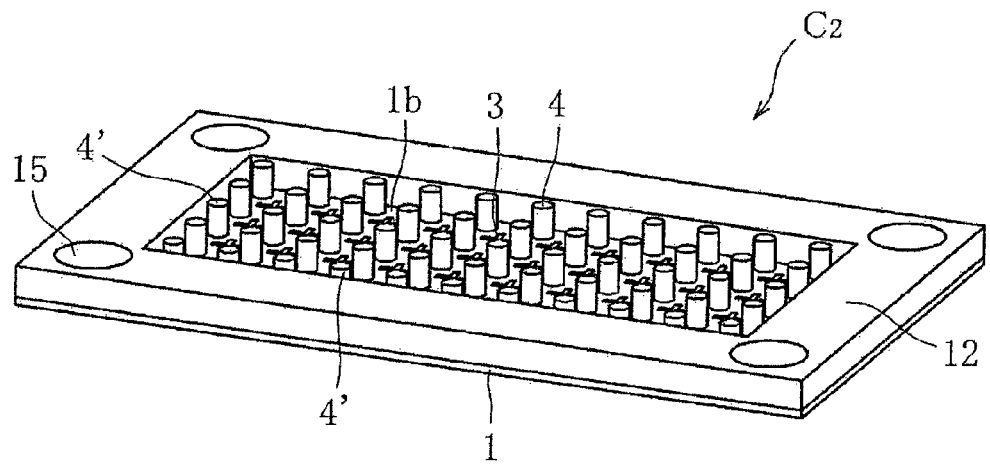
FIG. 8 is a perspective view showing a female connector $C_2$.

One example of the female connector $C_2$ is shown in FIG. 8.

The female connector $C_2$ has a structure where a member 12 for guiding the male terminal portions of the male connector to the slit openings of the female connector to fix them therein at an, assembling time of the male connector described later is arranged and fixed at a peripheral edge portion of the B face 1b of the insulating film 1 in the female connector $C_1$ shown in FIG. 7. Incidentally, the member is hereinafter called "female connector guide member".

Here, prior to explanation about the female connector $C_2$ r a preferable example $F_2$ of the male connector assembled to the female connector $C_2$ will be explained.

Figure 9:
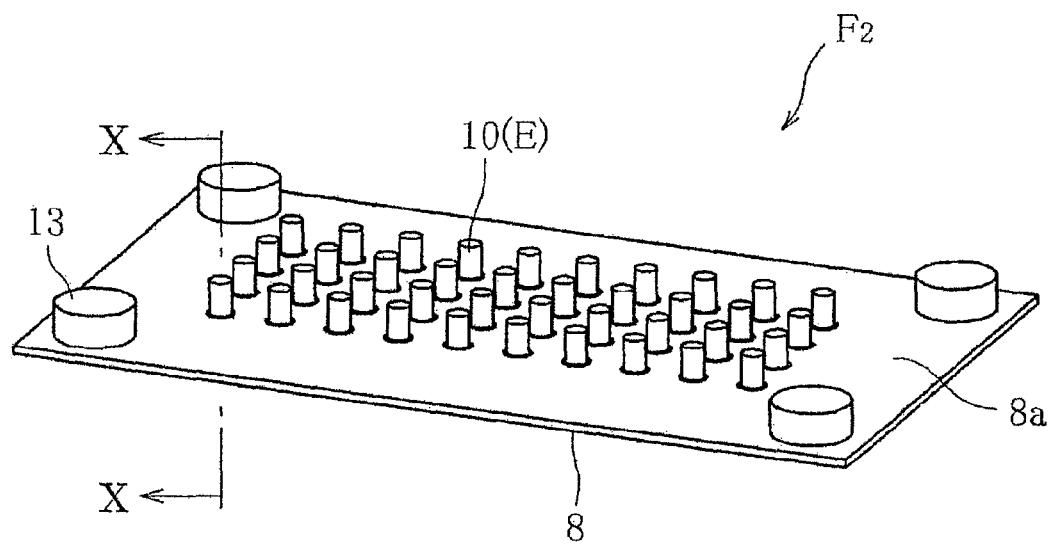
FIG. 9 is a perspective view showing a male connector $F_2$ assembled to the female connector $C_2$.
Figure 10:
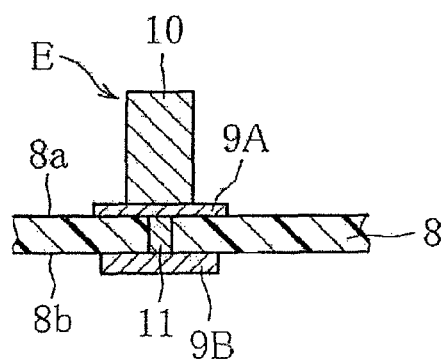
FIG. 10 is a sectional view of the male connector $F_2$ taken along line X-X in FIG. 9.

FIG. 9 is a perspective view of the male connector $F_2$, and FIG. 10 is a sectional view of the connector $F_2$ taken along line X-X in FIG. 9.

In the case of the male connector $F_2$, pads 9A are formed on one face 8a of an insulating flexible film 8 with an arrangement pattern thereof corresponding to the arrangement pattern of the slit openings 3 (female terminal portions D) of the female connector $C_2$ which is a mating member to be assembled. A protrusion 10 with a predetermined height is formed on each pad 9A as a male terminal portion E.

Pads 9B are formed on a face 8b of the flexible film 8 on the opposite side thereof at portions corresponding to the pads 9A as pads for mounting. The pad 9A and the pad for mounting 9B are electrically connected to each other via a conductive via 11 which is a column-shaped conductor formed in a thickness direction of the flexible film 8

Further, column-shaped bodies 13 provided so as to project in the same direction as the protrusions 10 (male terminal portions E) provided in a standing manner are formed at predetermined portions (four corners in the illustration) on a peripheral edge portion of one face 8a of the flexible film 8 as protrusions for engagement for performing engagement between the female connector guide member 12 of the female connector $C_2$ and the male connector $F_1$.

As the protrusion 10 (male terminal portion E), various aspects as described in Japanese Patent No. 4059522 can be adopted. Further, the protrusion 10 may be a solder ball fusion-bonded on the pad 9A or a metal pin pierced into the pad 9A, a distal end thereof being brought into contact with the pad 9B.

Figure 11:
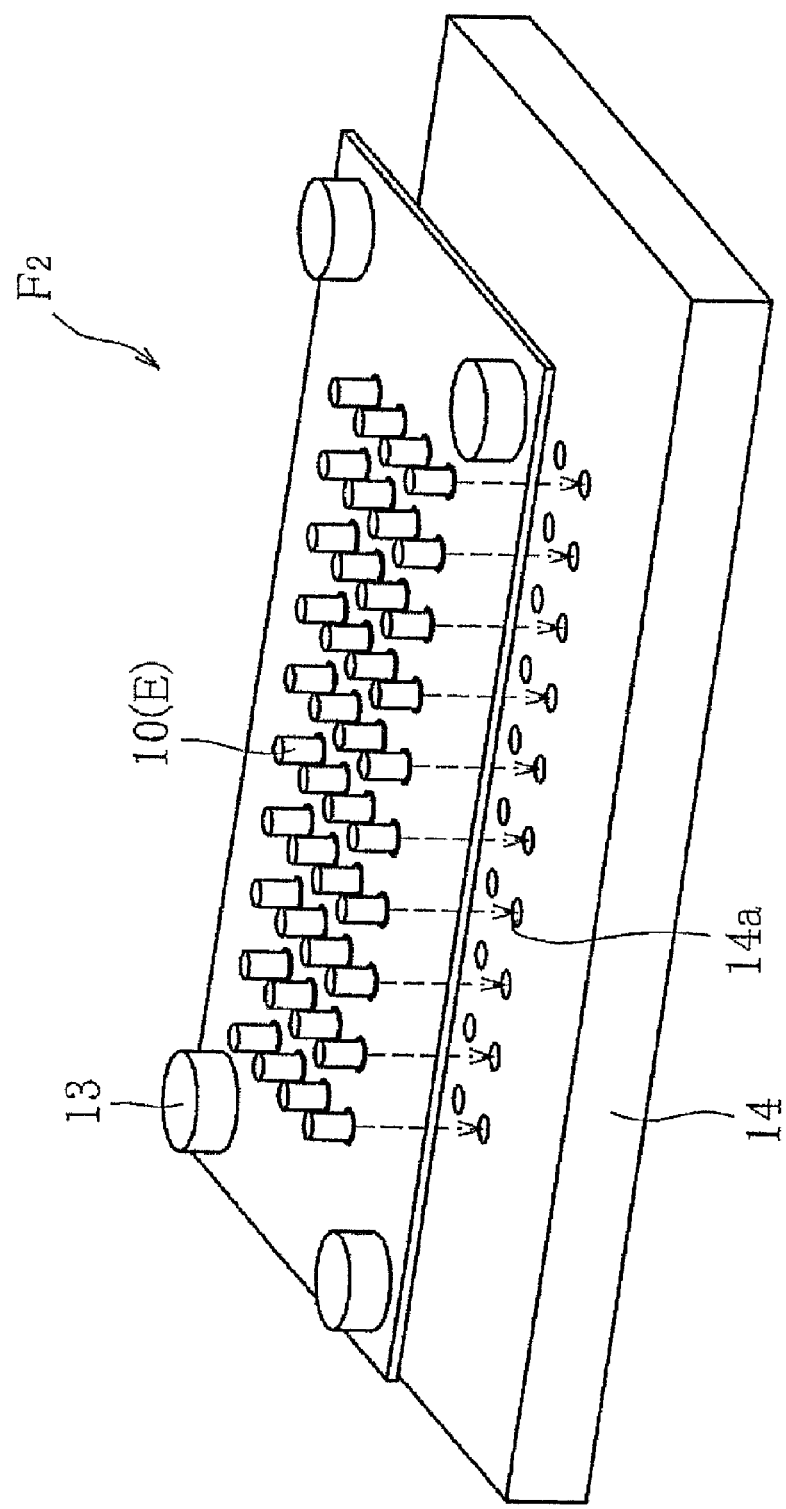
FIG. 11 is a perspective view showing a state that the male connector $F_2$ is mounted on a second circuit board.

Thus, the male connector $F_2$ is a mating member paired with the female connector $C_2$ and it is a male connector of a single item as itself. As shown in FIG. 11, the male connector $F_2$ is used while being mounted on a second circuit board 14.

In the second circuit board 14, input/output terminals 14a are formed on one face of the second circuit board 14 with a pattern corresponding to the arrangement pattern of the pads for mounting 9B of the male connector $F_2$. The male connector $F_2$ is disposed on the second circuit board 14, and the male connector $F_2$ is mounted on the second circuit board 14, for example, by performing soldering between the pads for mounting 9B and the input/output terminals 14a.

Here, returning back to the explanation about the female connector $C_2$, as shown in FIG. 8, the female connector $C_2$ has the structure where the female connector guide member 12 is arranged and fixed to the peripheral edge portion of the female connector $C_1$ shown in FIG. 7. The female connector guide member 12 is a frame-shaped member surrounding all of the arrangement group of the slit openings 3 (female terminal portions D), the arrangement group of the spacer bumps 4, and the arrangement group of the dummy spacer bumps 4' which are visually recognized on the side of the B face of the female connector $C_1$.

Engagement portions comprising a through-hole 15 engaged with the column-shaped body 13 (protrusion for engagement) of the male connector $F_2$ for positioning the male connector $F_2$ and the female connector $C_2$ to fix both the connectors are formed at four corners of the frame-shaped member.

Accordingly, in the case of the female connector $C_2$, through-holes (not shown) into which the column-shaped body 13 (protrusion for engagement) of the male connector $F_2$ can be inserted are also formed in the insulating film 1 just below the female connector guide member 12.

When the spacer bumps 4 and the dummy spacer bumps 4' are formed, for example, by applying photolithography technique and etching technique on the side of the B face 1b of the insulating film 1, the abovementioned female connector guide member 12 may be formed simultaneously by applying these techniques on the side of the B face 1b simultaneously. Such a method can be adopted that the female connector guide member 12 is manufactured as a separate member with a predetermined shape using metal or resin materials in advance and it is arranged and fixed on the B face 1b of the insulating film 1, for example, by adhesive or the like. However, since the latter method is likely to cause such a problem as extrusion of adhesive from a bonding face or insufficient bonding strength, it is desirable to adopt the former method.

Since the female connector $C_2$ thus manufactured is configured such that a frame-shaped member which is difficult to deform is arranged and fixed on the peripheral edge portion of the insulating film easily deformable, even if the protrusions 10 (male connection portions E) of the male connector $F_2$ are inserted into the slit openings 3 (female terminal portions D) at an assembling time of the male connector $F_2$ deformation of the insulating film 1 is effectively suppressed by insertion pressure of the protrusions 10 (male terminal portions E), so that an assembling work can be performed smoothly.

Assembling of the female connector $C_2$ and the male connector $F_2$ is performed in the following manner.

Figure 12:
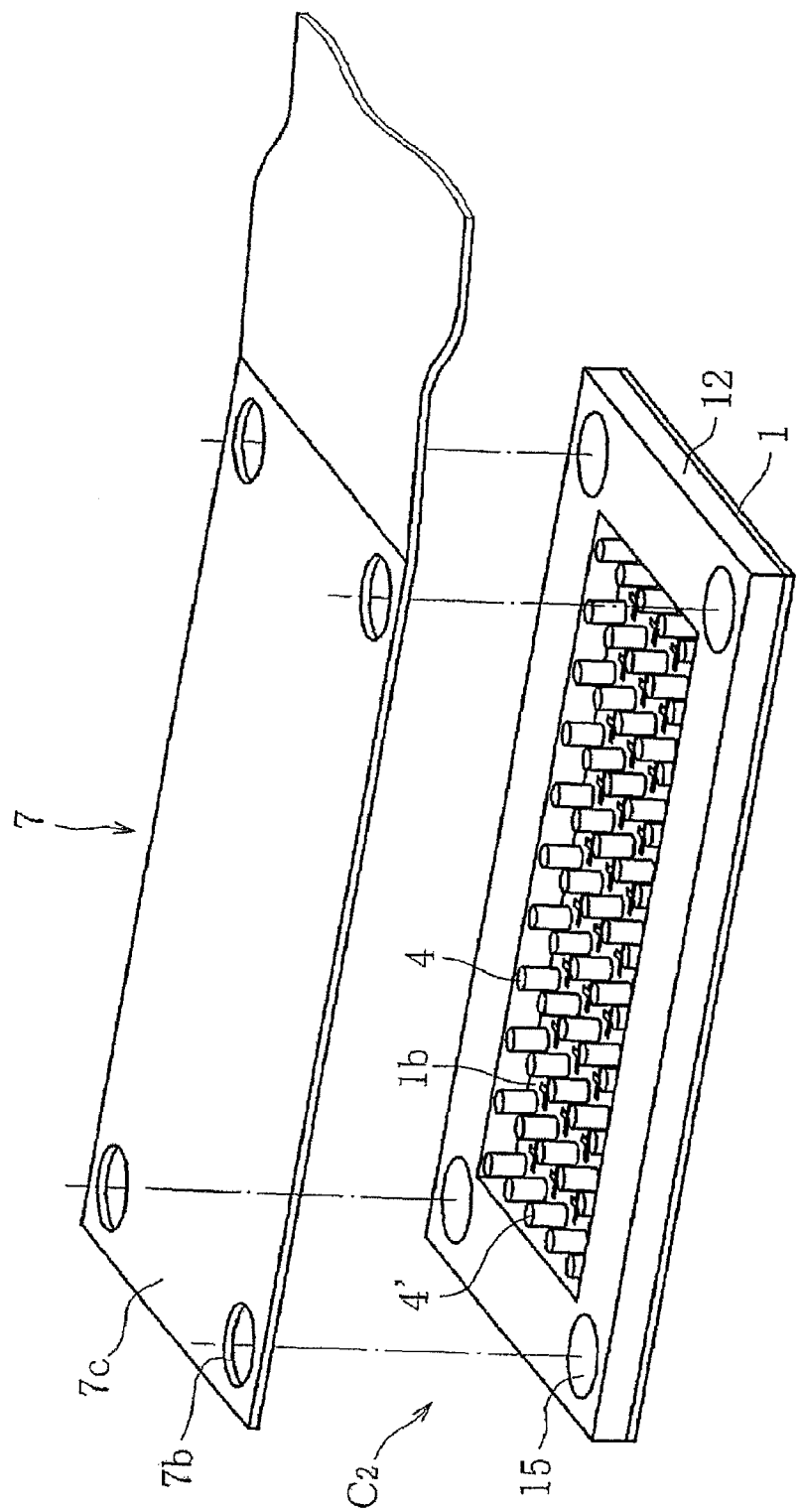
FIG. 12 is a perspective view showing a state that the female connector $C_2$ is mounted on a first circuit board.

As shown in FIG. 12, first, the first circuit board 7 such as the flexible circuit board shown in FIG. 5 is disposed so as to face the female connector $C_2$ on the side of the B face 1b of the female connector $C_2$ so that the arrangement groups of the spacer bumps 4 and the dummy spacer bumps 4' of the female connector $C_2$ are opposed to the arrangement group (not shown) of the input/output terminals 7a of the first circuit board 7.

Incidentally, holes 7b similar to the through-holes (engagement portions) 15 of the female connector guide member of the female connector $C_2$ are formed at portions corresponding to the through-holes 15 on four corners of the first circuit board 7. A reinforcement member 7c such as, for example, a polyimide film or a glass fiber epoxy composite plate is arranged on a face of the first circuit board 7 opposite to the face on which the input/output terminals are arranged, so that reinforcement processing is performed on the first circuit board 7.

Figure 13:
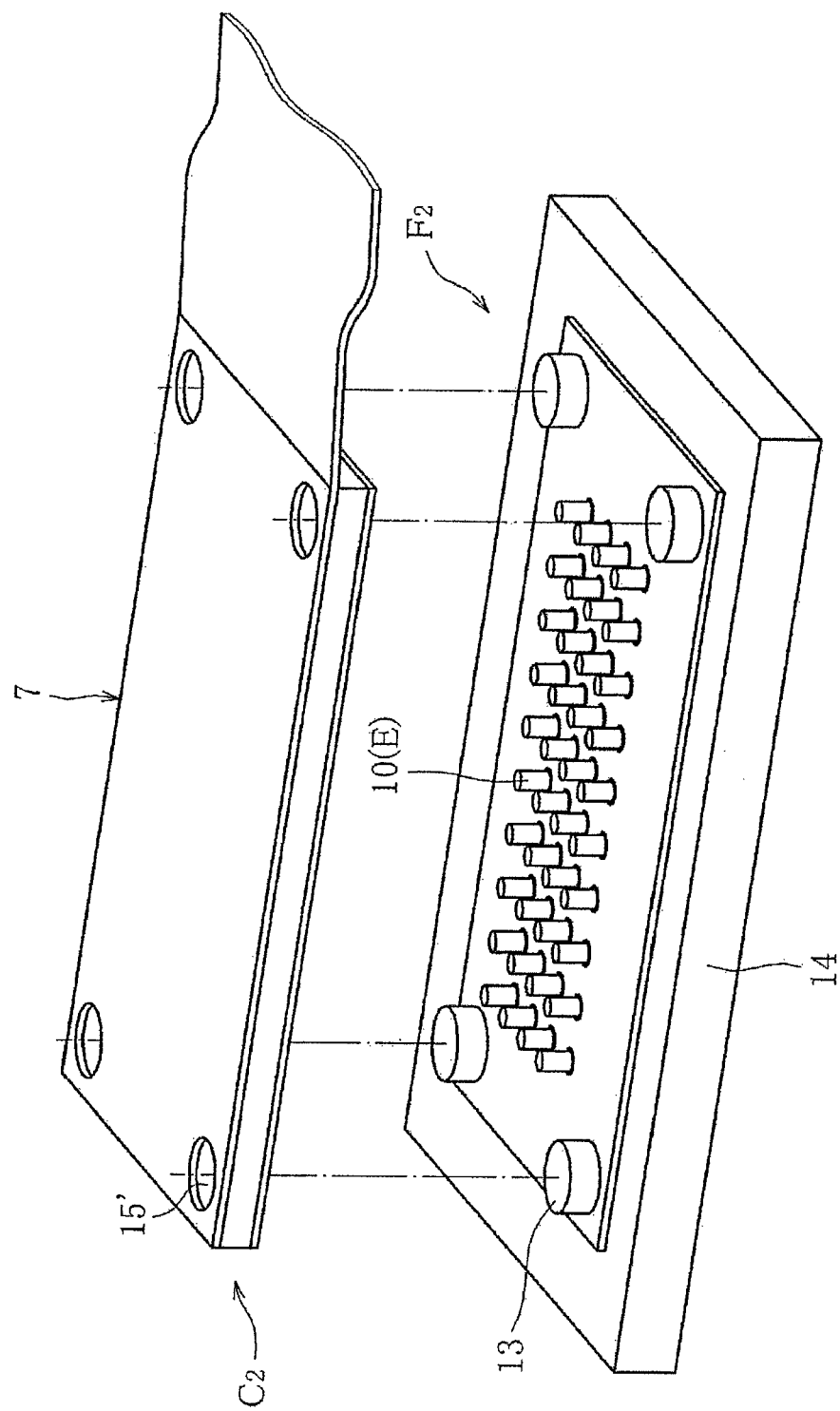
FIG. 13 is a sectional view showing a state that the female connector $C_2$ and the male connector $F_2$ are assembled to each other.

By connecting the spacer bumps 4 and the dummy spacer bumps 4' of the female connector $C_2$ and input/output terminals 7a of the first circuit board 7 corresponding thereto, the female connector $C_2$ and the first circuit board 7 are united to form an assembly having new through-holes 15' obtained by communication between the through-holes 15 of the female connector $C_2$ and the holes 7b of the first circuit board 7 on its four corners (FIG. 13).

Next, the male connector $F_2$ mounted on the second circuit board 14 as shown in FIG. 11 is arranged so as to face the female connector $C_2$ in the assembly on the side of the A face of the female connector $C_2$. The protrusions 10 (male terminal portions E) are inserted into the slit openings 3 (female terminal portions D) of the female connector $C_2$ simultaneously with insertion of the column-shaped bodies (protrusions for engagement) 13 of the male connector $F_2$ into the through-holes 15' of the assembly.

Figure 14:
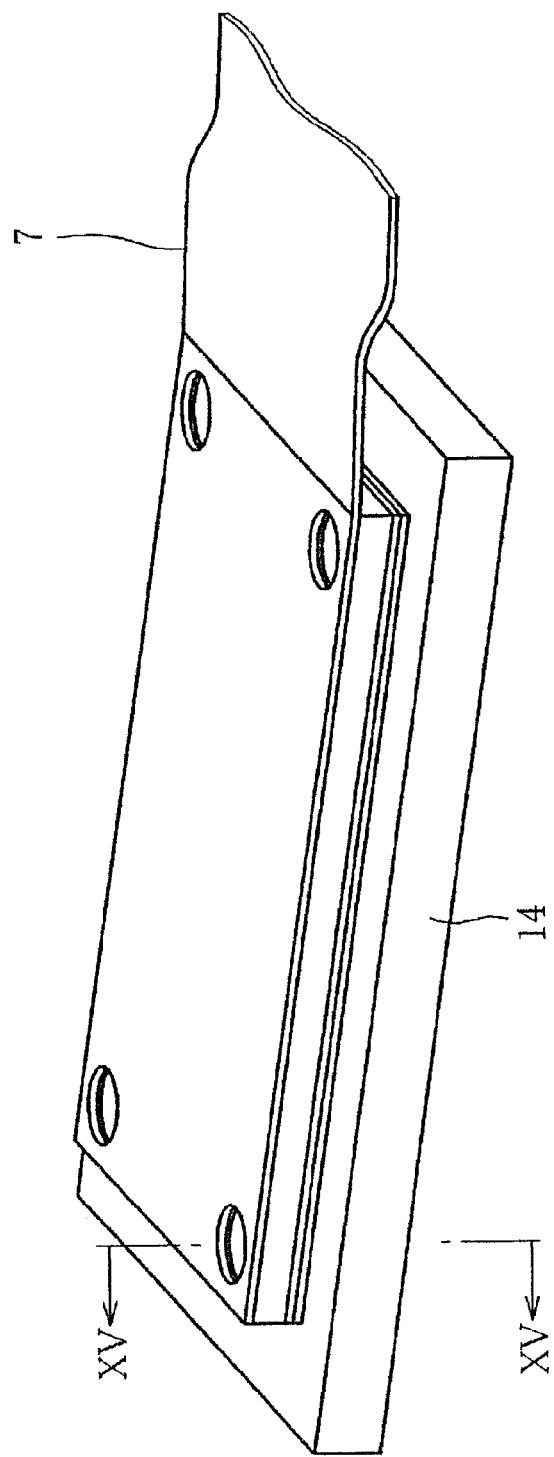
FIG. 14 is a perspective view showing a state that the male connector $F_2$ has been assembled to the female connector $C_2$.

As a result, as shown in FIG. 14, the female connector $C_2$ is assembled to the male connector $F_2$ so that both the connectors are unitized, where a transmission circuit for electric signals is formed between the first circuit board 7 and the second circuit board 14.

In the connector structure, a conduction structure is formed in the aspect shown in FIG. 6 between the slit openings 3 (female terminal portions D) of the female connector $C_2$ and the protrusions 10 (male terminal portions E) of the male connector $F_2$.

Figure 15:
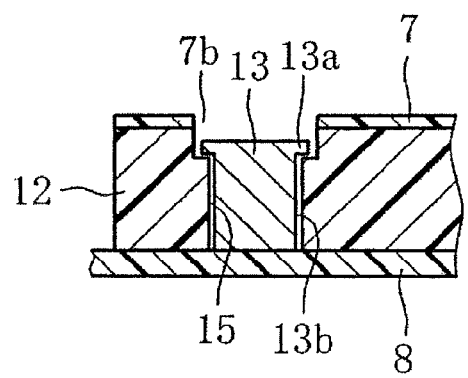
FIG. 15 is a sectional view of the assembled state of the male connector $F_2$ and the female connector $C_2$ taken along line XV-XV in FIG. 14.

Here, it is preferable that the through-hole (engagement portion) 15 of the female connector $C_2$ and the column-shaped body (protrusion for engagement) 13 of the male connector $F_2$ are formed in shapes as shown in FIG. 15 which is a sectional view taken along line XV-XV in FIG. 14. That is, a distal end top portion 13a of the column-shaped body (protrusion for engagement) 13 of the male connector $F_2$ is formed in a shape larger than a barrel portion 13b of the column-shaped body 13, and the through-hole (engagement portion) 15 of the female connector guide member 12 in the female connector $C_2$ is simultaneously formed in a stepped shape where an upper portion is larger in diameter than a lower portion.

When both the members are formed in the shapes described above, the through-hole 15 with the stepped portion functions as an engagement portion to the male connector. That is, the column-shaped portion (protrusion for engagement) 13 is engaged with the stepped portion of the through-hole (engagement portion) 15, so that both the connectors are positioned and fixed to each other.

Figure 16:
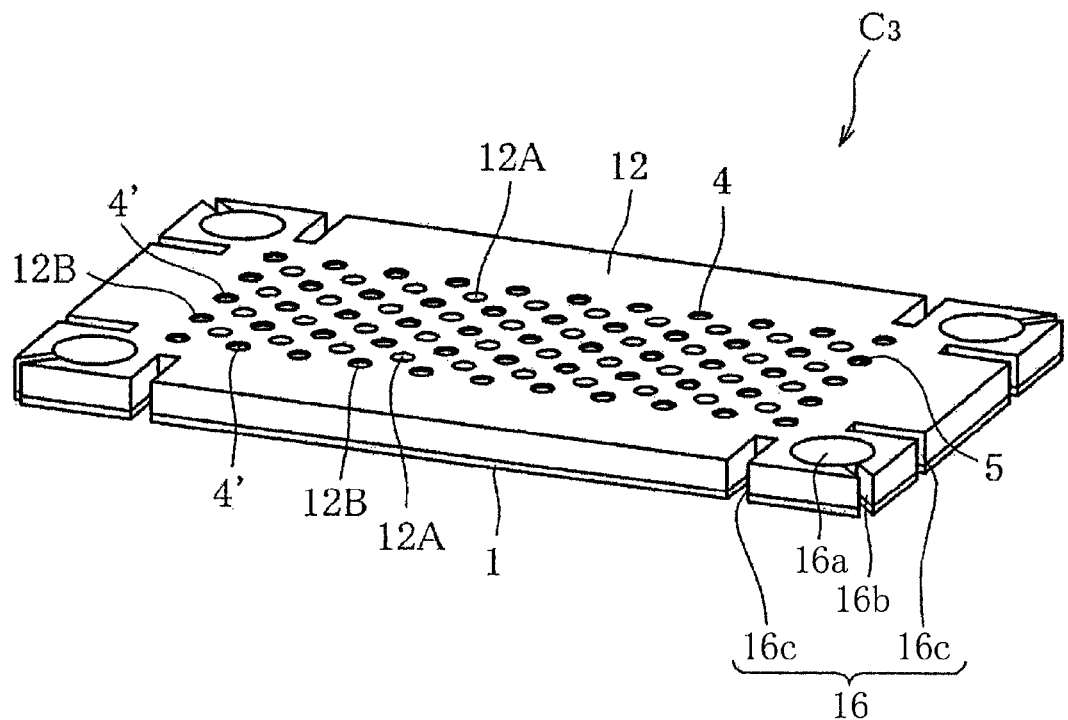
FIG. 16 is a perspective view showing another female connector $C_3$ of the present invention.

An example $C_3$ of still another female connector of the present invention is shown in FIG. 16.

The female connector $C_3$ has a structure where a plate-shaped female connector guide member 12 is arranged on the side of the B face of the female connector $C_1$ shown in FIG. 7 in a fixed manner so as to cover the whole B face.

As the female connector guide member 12, a metal sheet whose surface is applied with insulating coating or a resin sheet is used. The female connector guide member 12 is formed with first through-holes 12A with a section wide to surround the slit opening 3 (female terminal portion D) visually recognized on the side of the B face of the insulating film 1, respectively and second through-holes 12B with a size which can receive each of the spacer bumps 4 and the dummy spacer bumps 4' provided in a standing manner on the side of the B face like the first through-holes 12A, respectively, where the female connector guide member 12 configures a plate-shaped member as a whole.

The thickness of the female connector guide member is adjusted to have such a thickness that the distal end top portion of the spacer bump 4 received in the second through-holes 12B can be connected to the input/output terminal of the first circuit board arranged on the female connector guide member so as to face the same.

Further, engagement portions 16 engaged with the column-shaped bodies (protrusions for engagement) 13 of the male connector $F_2$ shown in FIG. 9 are formed on four corners of the female connector guide member.

Specifically, the engagement portions 16 comprising a through-hole 16a with a diameter slightly smaller than that of the column-shaped body (protrusion for engagement) 13 of the male connector $F_2$, a notch slit 16b obtained by cutting off a portion of a sidewall defining the through-hole 16a, and two notch slits 16c and 16c obtained by cutting off both sides of each through-hole 16a in the female connector $C_3$ are formed.

Since the engagement portion 16 has such a structure, when the column-shaped body with a diameter larger than that of the through-hole 16a is inserted into the through-hole 16a, the column-shaped body inserted is tightly fastened by flexure action of the notch slits according to diameter expansion of the through-hole 16a.

The female connector $C_3$ is mounted on the first circuit board 7 as shown in FIG. 12 and the assembly of the female connector $C_3$ and the first circuit board 7 is assembled to the male connector $F_2$ as shown in FIG. 13.

In the case of the female connector $C_3$, since the female connector guide member 12 is arranged on the whole face of the insulating film 1 in a fixed manner except for the slit openings and peripheral portions thereof and the spacer bumps and the dummy spacer bumps and peripheral portions thereof, namely, except for portions where the first through-holes 12A and the second through-holes 12B are positioned, any portion on the insulating film 1 is not flexed at an assembling time with the male connector $F_2$. Therefore, positional deviation between the individual female terminal portions D and corresponding male terminal portions E does not arise so that both the former and the latter can be assembled to each other in a lump.

Further, when the column-shaped bodies (protrusions for engagement) 13 of the male connector $F_2$ are inserted into the through-holes 16a in the engagement portions 16 of the female connector $C_3$ at the assembling time of the female connector $C_3$ and the male connector $F_2$, the column-shaped bodies 13 are fastened by the through-holes 16a so that the male connector $F_2$ is fixed in its positioned state.

Incidentally, in the case of the female connector $C_3$, since the whole face of the insulating film 1 is fixed by the female connector guide member 12 so that flexure is prevented from occurring, even if the dummy spacer bumps 4' provided in standing manner for preventing flexure of a portion of the insulating film positioned near the slit openings arranged at the outermost side are not formed, any drawback does not occur.

As apparent from the above explanation, the female connector according to the present invention is mounted on a circuit board on which a conductor circuit with a predetermined pattern has been already printed to be used, even if the first circuit board is a flexible circuit board, or a rigid circuit board. Further, the male connector which is a mating member for the female connector is used with a similar specification.

A connection portion of a connector structure assembled using the female connector and male connector can realize large reduction in height and space saving (multi-pin configuration) as compared with the case of the conventional connector structure. Accordingly, size reducing, thinning, and multifunction configuration of various electric/electronic apparatuses can be realized by using the female connector and the male connector according to the present invention.

From the above, the female connector and the male connector according to the present invention can be used as connection between an FPC (flexible circuit board) and another FPC or a connection connector between an FPC and an RPC (rigid circuit board) by mounting each of the connectors as a chip.

Further, the female connector and the male connector according to the present invention can be also used as an interposer which is an alternate connection member for wire bonding connection in a stacked package where CSPs (Chip Size Packages) are stacked and wired in a three-dimensional direction as application as a semiconductor package. In addition, the female connector and the male connector according to the present invention can be used by mounting them to various circuit boards incorporated into apparatuses such as a socket for a semiconductor package or a socket for semiconductor inspection.

For example, the female connector and the male connector according to the present invention can be used in a connection portion of a socket for a semiconductor package or a socket for semiconductor inspection strongly requiring a multi-pin configuration.

In the case of the socket for a semiconductor package, for example, a structure where contact terminals of a circuit board for inspection, the contact terminals such as contact pins or balls for contact formed on input/output terminals being arranged on a surface of the circuit board for inspection, are generally brought into pressure contact with pads arranged on a back face of a semiconductor package by utilizing spring force is conventionally adopted.

However, the following structure is obtained when the female connector and the male connector according to the present invention are used. That is, the distal end top portions of the spacer bumps of the female connector are directly connected to input/output terminals of a circuit board for inspection so that the female connector is mounted on the circuit board for inspection. On the other hand, for example, the pads for mounting 9B of the male connector $F_2$ are directly connected to pads of a semiconductor package so that the male connector is mounted on the semiconductor package.

Next, a conduction structure can be formed between the circuit board for inspection and the semiconductor package by inserting the male terminal portions E of the male connector into the female terminal portions D (slit openings) of the female connector.

In the case of the socket assembled in this manner, multi-pin configuration can be realized easily by enhancing formation densities of the female terminal portions and the male terminal portions, so that an area of the socket is made small. Further, the height of the connection portion can be reduced largely as compared with the case of the conventional contact pins, so that inductance and capacitance of the connection portion are also reduced, so that excellent electric signals can be obtained. Furthermore, since inserting and pulling-out forces between the male terminal portions and the female terminal portions are small, large pressure as the conventional force becomes unnecessary.

INDUSTRIAL APPLICABILITY

Since the female connector according to the present invention is configured by forming the female terminal portions on the insulating film rich in flexibility itself, it is a single mounting member which can satisfy space saving and height reduction of an assembled connector structure simultaneously. By mounting the female connector to the circuit board incorporated into various electric/electronic apparatuses, size reduction, thinning, and multi-function configuration of the electric/electronic apparatuses can be realized. Especially, when the female connector is used as an interposer for a stacked package, the female connector is useful when it is used in a socket for a semiconductor package, a socket for semiconductor inspection, or a copying machine for high image quality printing.

REFERENCE SIGNS LIST

1: insulating film
1$a$: one face of insulating film (A face)
1$b$: the other face of insulating film (B face)
2: pad portion
2$a$: one lateral portion of pad portion 2 (large diameter portion)
2$b$: the other lateral portion of pad portion 2 (small diameter portion)
3, $3_1$, $3_2$, $3_3$, $3_4$, 3A, 3B: slit opening
4: spacer bump
4': dummy spacer bump
4$a$: distal end top portion of spacer bump 4
5: column-shaped body
6: pad
7: flexible circuit board (first circuit board)
7$a$: input/output terminal of first circuit board
7$b$: through-hole
8: flexible film
8$a$: one face of flexible film 8
8$b$: the other face of flexible film 8
9A: pad
9B: pad for mounting
10: protrusion (male terminal portion)
11: conductive via
12: female connector guide member
12A first through-hole
12B: second through-hole
13: column-shaped body (protrusion for engagement)
14: second circuit board
15: through-hole (engagement portion)
15': through-hole
16: engagement portion
16$a$: through-hole
16$b$, 16$c$: notch slit
$C_0$: basic structure of female connector of the present invention
$C_1$: another female connector of the present invention
$C_2$: still another female connector of the present invention
$C_3$: still another female connector of the present invention
D: female terminal portion
E: male terminal portion
$F_1$, $F_2$: male connector

The invention claimed is:
1. A female connector comprising:
an insulating film having flexibility;
a plurality of pad portions formed at predetermined positions on one face of the insulating film in an arranged manner;
female terminal portions comprising openings formed at one lateral portions within faces of the pad portions so as to extend up to the other face of the insulating film; and
spacer bumps formed at positions corresponding to the other lateral positions within the faces of the pad portions in a standing manner within the other face of the insulating film, proximal portions of the spacer bumps being electrically connected to the pad portions.
2. The female connector according to claim 1, wherein the proximal portions of the spacer bumps are electrically connected to the pad portions via column-shaped conductors formed in a thickness direction of the insulating film.
3. The female connector according to claim 1, wherein the spacer bumps are metal pins provided on the insulating film from the other face of the insulating film in a planting manner to contact the pad portions.
4. The female connector according to claim 1, wherein shapes of the pad portions in plan view are Daruma shapes, the openings are formed in larger diameter portions of the Daruma shapes, and the spacer bumps are provided on the other face of the insulating film in a standing manner at the portions where the smaller diameter portions of the Daruma shapes are formed.

5. The female connector according to claim 1, wherein
when rectangular shapes are each drawn by connecting the center of four openings adjacent to each other in arrangement group of the openings arranged on the other face of the insulating film and visually recognized, the spacer bumps are provided at intersection points of orthogonal lines of the rectangular shapes in a standing manner.

6. The female connector according to claim 1, wherein
dummy spacer bumps having the same height as the spacer bumps are further provided in a standing manner outside the openings positioned on an outermost side row included in arrangement groups of the openings and the spacer bumps arranged on the other face of the insulating film and visually recognized.

7. The female connector according to claim 1, wherein
distal end top portions of the spacer bumps are electrically connected to output/input terminals of a first circuit board on which a conductor circuit having a predetermined pattern is printed.

8. The female connector according to claim 1, wherein
a male connector used as a mating member incorporated with the female connector is a male connector comprising an insulating flexible film, pads for mounting formed on one face of the flexible film, male terminal portions provided on the other face of the flexible film in a projecting manner, proximal portions of the male terminal portions being electrically connected to the pads for mounting, and protrusions for engagement formed on a peripheral portion of the flexible film so as to project in the same direction as the directions of the male terminal portions, where the pads for mounting are electrically connected to input/output terminals of a second circuit board on which a conductor circuit having a predetermined pattern is printed to be mounted on the second circuit board.

9. The female connector according to claim 8, wherein
the male terminal portions of the male connector are metal pins provided on the flexible film from the other face of the flexible film in a planting manner, proximal portions of the metal pins contacting the pads for mounting.

10. The female connector according to claim 8, wherein
the protrusions for engagement of the male connector are pins provided in the flexible film in a planting manner.

11. The female connector according to claim 8, wherein
a female connector guide member for suppressing occurrence of flexure of the insulating film at an assembling time of the male connector into the female connector and guiding the male terminal portions of the male connector assembled into the openings and fixing the male terminal portions therein is arranged on the other face of the insulating film in the female connector in a fixing manner.

12. The female connector according to claim 11, wherein
the female connector guide member is formed by an electroplating process outside the spacer bumps or the dummy spacer bumps formed on the other face of the insulating film in an arranged manner.

13. The female connector according to claim 11, wherein
the female connector guide member is a frame-shaped member positioned on the other face of the insulating film in a fixing manner so as to surround all of an arrangement group of the openings, an arrangement group of the dummy spacer bumps and an arrangement group of the dummy spacer bumps which are visually recognized on the other face of the insulating film of the female connector, and the frame-shaped member has a plurality of engagement portions which can be engaged with the protrusions for engagement of the male connector.

14. The female connector according to claim 13, wherein
the protrusions for engagement are column-shaped bodies having distal end portions larger in diameter than barrel portions thereof, and the engagement portions are through-holes having step portions including upper portions larger in diameter than lower portions.

15. The female connector according to claim 11, wherein
the female connector guide member is a plate-shaped member comprising first through-holes having sections wide to surround the openings arranged on the other face of the insulating film of the female connector and visually recognized, respectively, and second through-holes receiving the spacer bumps arranged and provided in a standing manner like the first through-holes, respectively, and
engagement portions which can be engaged with the protrusions for engagement of the male connector are formed on the plate-shaped member.

16. The female connector according to claim 15, wherein
the protrusions for engagement are column-shaped bodies, and the engagement portions each comprising a through-hole smaller in diameter than the column-shaped bodies and a cutoff slit formed therein.

17. A male connector which is assembled into the female connector according to claim 1 comprising:
an insulating flexible film, pads for mounting formed on one face of the flexible film, male terminal portions provided on the other face of the flexible film in a projecting manner, proximal portions of the male terminal portions being electrically connected to the pads for mounting, and protrusions for engagement formed on a peripheral portion of the flexible film so as to project in the same direction as the directions of the male terminal portions, wherein the pads for mounting are electrically connected to input/output terminals of a second circuit board on which a conductor circuit having a predetermined pattern is printed to be mounted on the second circuit board.

18. An electric/electronic assembly which has output/input terminals for electric signal incorporated with a circuit board mounted with the female connector according to claim 1.

19. A semiconductor package socket or a socket for semiconductor inspection incorporated with the female connector according to claim 1.

* * * * *